United States Patent
Willis et al.

(10) Patent No.: US 12,328,118 B2
(45) Date of Patent: Jun. 10, 2025

(54) CHANNEL BASED CONFIGURABLE CML, LVDS, OPEN DRAIN OUTPUT

(71) Applicant: RAYTHEON COMPANY, Waltham, MA (US)

(72) Inventors: Magathi Willis, Broomfield, CO (US); Micky R. Harris, Lompoc, CA (US)

(73) Assignee: Raytheon Company, Arlington, VA (US)

( * ) Notice: Subject to any disclaimer, the term of this patent is extended or adjusted under 35 U.S.C. 154(b) by 147 days.

(21) Appl. No.: 18/223,371

(22) Filed: Jul. 18, 2023

(65) Prior Publication Data
US 2025/0030421 A1    Jan. 23, 2025

(51) Int. Cl.
*H03K 19/0175*    (2006.01)
(52) U.S. Cl.
CPC ............... *H03K 19/017545* (2013.01)
(58) Field of Classification Search
CPC .................................................. H03K 19/0175
See application file for complete search history.

(56) References Cited

U.S. PATENT DOCUMENTS

| 6,847,232 | B2 | 1/2005 | Tinsley et al. |
| 7,012,450 | B1 * | 3/2006 | Oner ............ H04L 25/0276 326/86 |
| 7,304,494 | B2 | 12/2007 | Wong et al. |
| 7,564,270 | B1 * | 7/2009 | Zhang ........... H03K 19/00384 327/108 |

* cited by examiner

*Primary Examiner* — Patrick O Neill

(57) ABSTRACT

A configurable driver is presented, comprising: a first transistor of a first type coupled to a first node; a second transistor of the first type coupled to a second node; a first transistor of a second type coupled to the first node; a second transistor of a second type coupled to the second node; a first multiplexer coupled to a gate of the first transistor of the first type; a second multiplexer coupled to a gate of the second transistor of the first type; a third multiplexer coupled to a gate of the first transistor of the second type; a fourth multiplexer coupled to a gate of the second transistor of the second type; and one or more switching devices coupled between the first node and the second node.

22 Claims, 8 Drawing Sheets

CHANNEL BASED CONFIGURABLE CML, LVDS, OPEN DRAIN OUTPUT

BACKGROUND

1. Field of the Disclosure

At least one example in accordance with the present disclosure relates generally to drivers for electronics and communication devices.

2. Discussion of Related Art

Drivers provide electrical signals (typically of logical "1" or "0") as outputs. Accordingly, drivers can be used to provide a sequence of bits that may encode data, and may transmit that data via conductive connections to the output of the driver.

SUMMARY

According to at least one aspect of the present disclosure a configurable driver is presented, comprising: a first transistor of a first type coupled to a first node; a second transistor of the first type coupled to a second node; a first transistor of a second type coupled to the first node; a second transistor of a second type coupled to the second node; a first multiplexer coupled to a gate of the first transistor of the first type; a second multiplexer coupled to a gate of the second transistor of the first type; a third multiplexer coupled to a gate of the first transistor of the second type; a fourth multiplexer coupled to a gate of the second transistor of the second type; and one or more switching devices coupled between the first node and the second node.

In some examples, the configurable driver further comprises a high voltage node coupled to a transistor; and an amplifier coupled to the transistor, wherein the transistor is coupled to the first transistor of the first type and the second transistor of the first type. In some examples, an input of the amplifier is coupled between the first node and the second node. In some examples, the configurable driver further comprises a low voltage node coupled to a transistor, wherein the transistor is coupled to the first transistor of the second type and the second transistor of the second type. In some examples, the configurable driver further comprises a node coupled between a first switching device and a second switching device of the one or more switching devices; a transistor coupled between the node and a high voltage node; and a multiplexer coupled to a gate of the transistor. In some examples, the multiplexer is configured to provide a voltage to the gate of the transistor, the voltage selected from among a set including a first voltage and a second voltage, the first voltage being less than the second voltage. In some examples, the first multiplexer is configured to provide a first voltage and a second voltage to the gate of the first transistor of the first type, the first voltage being less than the second voltage; the second multiplexer is configured to provide a third voltage and a fourth voltage to the gate of the second transistor of the first type, the third voltage being less than the fourth voltage; the third multiplexer is configured to provide a fifth voltage and a sixth voltage to the gate of the first transistor of the second type, the fifth voltage being less than the sixth voltage; and the fourth multiplexer is configured to provide a seventh voltage and an eight voltage to the gate of the second transistor of the second type, the seventh voltage being less than the eight voltage.

In some examples, the multiplexed driver is configured to operate in two or more modes of operation based on a configuration of one or more of the first multiplexer, second multiplexer, third multiplexer, and fourth multiplexer. In some examples, the two or more modes of operation include: a CML mode of operation; an LVDS mode of operation; and an OD mode of operation. In some examples, the configurable driver operates in the CML mode of operation when: the first multiplexer provides a high voltage to the gate of the first transistor of the first type; the second multiplexer provides a high voltage to the gate of the second transistor of the first type; a first switch of the two or more switching devices is closed; and a second switch of the two or more switching devices is closed. In some examples, the configurable driver operates in the LVDS mode of operation when: the first multiplexer provides a voltage to the gate of the first transistor of the first type derived from a first voltage input of the configurable driver; the second multiplexer provides a voltage to the gate of the second transistor of the first type derived from a second voltage input of the configurable driver; the third multiplexer provides a voltage to the gate of the first transistor of the second type derived from the first voltage input; and the fourth multiplexer provides a voltage to the gate of the second transistor of the second type derived from the second voltage input.

In some examples, a first switch of the two or more switching devices is closed; and a second switch of the two or more switching devices is closed. In some examples, the configurable driver operates in the OD mode of operation when: the first multiplexer provides a high voltage to the gate of the first transistor of the first type; the second multiplexer provides a high voltage to the gate of the second transistor of the first type; a first switch of the two or more switching devices is open; and a second switch of the two or more switching devices is open.

According to at least one aspect of the present disclosure, a method of determining a mode of operation for a multiplexed driver is presented, the method comprising: determining the mode of operation for the multiplexed driver selected from among a plurality of modes of operation; responsive to determining the mode of operation: setting a state of a first multiplexer coupled to a gate of a first transistor of a first type, setting a state of a second multiplexer coupled to a gate of a second transistor of the first type, setting a state of a third multiplexer coupled to a gate of a first transistor of a second type, and setting a state of a fourth multiplexer coupled to a gate of a second transistor of the second type; and responsive to setting a state of a multiplexer: setting a state of at least one switch coupled between the first multiplexer, the second multiplexer, the third multiplexer, and the fourth multiplexer.

In some examples, the mode of operation is an open drain (OD) mode of operation. In some examples, setting a state of the first multiplexer includes setting the first multiplexer to provide a high voltage; setting a state of the third multiplexer includes setting the third multiplexer to provide a high voltage; and setting a state of the at least one switch to be open. In some examples, the method further comprises setting a state of a fifth multiplexer to provide a low voltage. In some examples the mode of operation is a low voltage differential signaling (LVDS) mode of operation. In some examples, setting a state of the first multiplexer includes setting the first multiplexer to provide a voltage derived from a first input; setting a state of the third multiplexer includes setting the third multiplexer to provide a voltage derived from a second input; and setting a state of the at least one switch to be closed. In some examples, the method further comprises setting a state of a fifth multiplexer to provide a high voltage. In some examples, the mode of operation is a current mode logic (CML) mode of operation. In some examples, setting a state of the first multiplexer includes setting the first multiplexer to provide a high voltage; setting a state of the third multiplexer includes setting the third multiplexer to provide a high voltage; and setting a state of the at least one switch to be closed.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
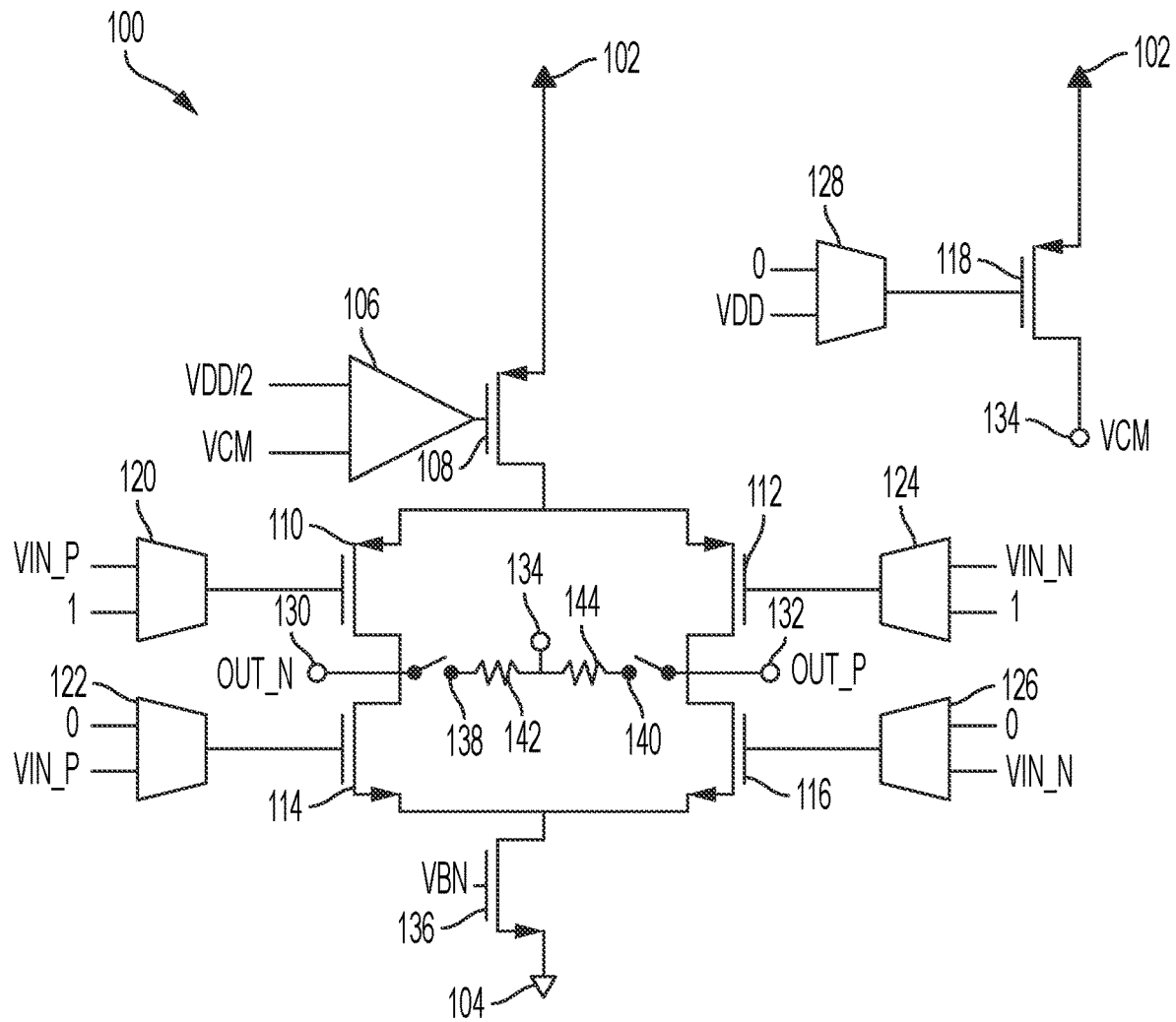
FIG. 1 illustrates a driver according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Output drivers may be used to drive circuits in a variety of ways. Current mode logic (CML) drivers use a current that is steered between alternate paths depending on whether a high or low value (e.g., logical "1" or "0") is being provided to the gates of various transistors in most CML topologies. A low voltage differential signaling (LVDS) driver, which may be based on the TIA/EIA-644 standard, presents data using the difference between two voltages. LVDS drivers often receive a constant current with the direction of the current (that is, the polarity of the voltage) determining the logic level (e.g., "1" or "0"). Open drain (OD) drivers may pull a pin (e.g., an output) to a desired voltage level or ground to represent the logic level. Each driver method has advantages and disadvantages. For instance, OD drivers tend to have short ranges for transmitting data and relatively low data rates (e.g., less than 4 Mbps) while LVDS drivers have moderate range and data rates (e.g., approximately 5 Gbps), and CML drivers tend to have high range and high data rates (e.g., greater than 6 Gbps). As a trade-off, OD drivers tend to use less power than LVDS drivers, and LVDS drivers tend to use less power than CML drivers.

Channel-based configurable drivers ("multiplexed drivers"), discussed herein, can operate as OD, CML, or LVDS drivers using an adaptable and versatile circuit topology. To achieve this level of versatility, the complexity of the multiplexed driver (relative to CML, LVDS, OD, and some other types of drivers) is increased through the incorporation of multiplexers, and other circuit elements, which may be used to choose the operating mode of the multiplexed driver. Because the multiplexed driver is programmable and can function as an OD, CML, or LVDS driver, for any given application the multiplexed driver can be configured to operate in the mode best-suited to that application. As a result, a single multiplexed driver can be used in place of an OD, CML, or LVDS driver to provide greater flexibility and control during use.

FIGS. 1-4 illustrate a channel-based configurable driver 100 ("multiplexed driver 100") according to various examples. In the discussion of FIGS. 1-4, various transistors are mentioned. These transistors may be n-type and/or p-type. When referring to the gate voltages provided to the gates of these transistors, "0" shall refer to a voltage of 0V with respect to some common reference node, while a "high" voltage shall refer to a positive voltage (e.g., a voltage greater than 0V), and a "low" voltage shall refer to a negative voltage (e.g., a voltage less than 0V). In some examples, a low voltage must be low enough (e.g., negative enough) to cause the p-type transistors associated with it to conduct, while a high voltage must be high enough (e.g., positive enough) to cause the n-type transistors associated with it to conduct.

FIG. 1 illustrates channel-based configurable driver 100 ("multiplexed driver 100") according to an example. The multiplexed driver 100 may be configured to operate in a plurality of modes, including an OD mode, a CML mode, and LVDS mode. One or more controllers (not shown) may control the various multiplexers of the multiplexed driver 100 to switch the multiplexed driver 100 between operating modes. The output of the multiplexed driver 100 (measured at a variety of possible places, including the first output node 130 and second output node 132) may be mapped to values of logical "1" and "0." That is, a first range of output voltages of the multiplexed driver 100 may correspond to logical "1," while a second, non-overlapping range of voltages may correspond to logical "0," and a third range of voltage values may lie between and separate the first range and the second range and not correspond to any logical value.

The multiplexed driver 100 includes a high voltage node 102, a low voltage node 104, an amplifier 106, a first transistor 108, a second transistor 110, a third transistor 112, a fourth transistor 114, a fifth transistor 116, a sixth transistor 118, a first multiplexer 120, a second multiplexer 122, a third multiplexer 124, a fourth multiplexer 126, a fifth multiplexer 128, a first output node 130, a second output node 132, a VCM node 134, a seventh transistor 136, a first switching device 138 ("first switch 138"), a second switching device 140 ("second switch 140"), a first resistor 142, and a second resistor 144.

The first transistor 108 is coupled to the high voltage node 102 at a first connection, to the amplifier 106 via a gate connection, and to the second transistor 110 and third transistor 112 via a third connection. The amplifier 106 is coupled to the first transistor 108 via a first connection, to a high voltage (such as the input voltage or a "VDD" voltage) via a second connection, and to the VCM node 134 via a third connection. The second transistor 110 is coupled to the first transistor 108 and third transistor 112 via a first connection, the first output node 130 and fourth transistor 114 via a second connection, and the first multiplexer 120 via a gate connection. The third transistor 112 is coupled to the first transistor 108 and second transistor 110 via a first connection, to the second output node 132 and fifth transistor 116 via a second connection, and to the third multiplexer 124 via a gate connection. The fourth transistor 114 is coupled to the second transistor 110 and the first output node 130 via a first connection, to the fifth transistor 116 and seventh transistor 136 via a second connection, and to the second multiplexer 122 via a gate connection. The fifth transistor 116 is coupled to the third transistor 112 and second output node 132 via a first connection, to the fourth transistor 114 and seventh transistor 136 via a second connection, and to the fourth multiplexer 126 via a gate connection. The sixth transistor 118 is coupled to the high voltage node 102 via a first connection, to the VCM node 134 via a second connection, and to the fifth multiplexer 128 via a gate connection. The first multiplexer 120 is coupled to a gate of the second transistor 110 via a gate connection, to a positive input voltage via a second connection, and to a logical "1" value via a third connection. The second multiplexer 122 is coupled to a gate of the fourth transistor 114 via a gate connection, to logical "0" via a first connection, and to the positive input voltage via a third connection. The third multiplexer 124 is coupled to a gate of the third transistor 112 via a gate connection, to logical "1" via a first connection, and to a negative input voltage via a third connection. The fourth multiplexer 126 is coupled to a gate of the fifth transistor 116 via a gate connection, to logical "0" via a first connection, and to the negative input voltage via a third connection. The fifth multiplexer 128 is coupled to a gate of the sixth transistor 118 via a gate connection, logical "0" via a first connection, and a high voltage, such as VDD, via a third connection. The seventh transistor 136 is coupled to the low voltage node 104 via a first connection, to the fourth transistor 114 and fifth transistor 116 via a second connection, and to an input voltage ("VBN") via a gate connection. The first switch 138 is coupled to the VCM node 134 and to the second switch 140 via the first resistor 142, and to the second transistor 110, fourth transistor 114, and first output node 130 via a first connection. The second switch 140 is coupled to the VCM node 134 and to the first switch 138 via a the second resistor 144, and to the third transistor 112, fifth transistor 116, and second output node 132 via a first connection.

In the example provided in FIG. 1, the following table indicates which configurations of the multiplexers and switches correspond to desired operation modes of the multiplexed driver 100. For the purposes of the table, the first multiplexer 120 is "MX1," the second multiplexer 122 is "MX2," the third multiplexer 124 is "MX3," the fourth multiplexer 126 is "MX4," the fifth multiplexer 128 is "MX5," the first switch 138 is "S1," and the second switch 140 is "S2."

| MODE | MX1 | MX2 | MX3 | MX4 | MX5 | S1 | S2 |
|------|-----|-----|-----|-----|-----|----|----|
| OD   | 1   | VIN_P | 1 | VIN_N | 0 | Open | Open |
| LVDS | VIN_P | VIN_P | VIN_N | VIN_N | 1 | Closed | Closed |
| CML  | 1   | VIN_P | 1 | VIN_N | 0 | Closed | Closed |

It should be noted that, since the second multiplexer 122 and fourth multiplexer 126 are always set to "VIN_P" or "VIN_N" for each mode, one or more of the second multiplexer 122 and fourth multiplexer 126 may be omitted and replaced with inputs providing VIN_P or VIN_N.

As illustrated, the first transistor 108, second transistor 110, third transistor 112, and sixth transistor 118 may be one type of field effect transistor (FET), for example p-type. The fourth transistor 114, fifth transistor 116, and seventh transistor 136 may be a different type of FET, for example n-type. In general, n-type FETs may be normally open (e.g., "off" or "non-conducting" when no voltage is applied to the gate), and p-type FETs may be normally closed (e.g., "on" or "conducting" when no voltage is applied to the gate).

The various multiplexers determine whether a given FET is closed or open. The first multiplexer 120 determines whether the second transistor 110 is closed or open depending on whether a voltage is provided to the gate and the value of the voltage provided to the gate. VIN_P is the input voltage for the positive voltage input of the circuit, and "1" is a voltage corresponding to a high voltage. Thus, if "1" is provided to the gate of the second transistor 110, the second transistor 110 is open (e.g., not conducting appreciable amounts of current). Likewise, if VIN_P is low (e.g., 0V or a value less than 0V for the n-type FETs), the second transistor 110 is closed (e.g., conducting appreciable amounts of current). The second multiplexer 122 provides similar control over the fourth transistor 114. The second multiplexer 122 has a "0" input and a VIN_P input. The "0" input may indicate a low voltage (e.g., a voltage less than or equal to 0V with respect to the p-type FETs), and VIN_P may be a variable input (i.e., VIN_P may be low, high, or zero). Because the fourth transistor 114 is (in this example) n-type, it is normally off, meaning that the low voltage "0" causes the fourth transistor 114 to be in an open state (not conducting), while if VIN_P is high (e.g., logical "1"), the fourth transistor 114 is closed and may conduct. If VIN_P is low or zero, the fourth transistor 114 may be open.

The third multiplexer 124 has an input for a high voltage ("1") and VIN_N. VIN_N, like VIN_P, may be a variable input (VIN_N may be high, low, or zero). If the third multiplexer 124 provides a high voltage to the third transistor 112, the third transistor 112 may not conduct. If the third multiplexer 124 provides VIN_N to the third transistor 112, if VIN_N is low the third transistor 112 may conduct, while if VIN_N is high, the third transistor 112 may not conduct. The fifth multiplexer 128 has inputs for "0" and VDD. VDD refers to a positive voltage value (e.g., a voltage greater than 0, for example 1V, 3.2V, 5V, and so forth). VDD may correspond to the voltage at the high voltage node 102. The sixth transistor 118 will be closed if the fifth multiplexer 128 provides a low voltage ("0") to the gate of the sixth transistor 118, and will be open if the fifth multiplexer 128 provides VDD to the gate.

The fourth multiplexer 126 provides either a low voltage ("0") or VIN_N to the gate of the fifth transistor 116. If the fourth multiplexer 126 provides the low voltage to the fifth transistor 116, the fifth transistor 116 will be open. If the fourth multiplexer 126 provides VIN_N to the fifth transistor 116, if VIN_N is high, the fifth transistor 116 will be closed, and if VIN_N is low, the fifth transistor 116 will be open.

The first transistor 108 is driven by the amplifier 106. The amplifier 106 provides an output based on VDD/2 and VCM, in this example. VCM is the common mode voltage measured at the VCM node 134, located between the first switch 138 and the second switch 140 (and also coupled to the sixth transistor 118). If the amplifier 106 provides a high voltage output to the gate of the first transistor 108, the first transistor 108 will be open, and if the amplifier 106 provides a low voltage output, the first transistor 108 will be closed.

The seventh transistor 136 receives an input, VBN, at its gate. If VBN is low, the seventh transistor 136 will be open, and if VBN is high, the seventh transistor 136 will be closed. In some examples, VBN may be a constant bias voltage that can be tuned using a digital-to-analog converter (DAC) to control the current provided at the gate of the seventh transistor 136.

The high voltage node 102 may provide a high voltage, such as VDD, to the multiplexed driver 100. The low voltage node 104 may be reference node (such as a connection to ground or neutral), or may provide a low voltage (such as a negative voltage) to the multiplexed driver 100.

The first output node 130 and second output node 132 may be nodes where voltages are measured (e.g., to determine a differential voltage).

As mentioned above, VIN_P and VIN_N may be variable inputs capable of being high or low. In some examples, VIN_P may be high when VIN_N is low (or zero), and VIN_N may be high when VIN_P is low (or zero). In some examples, VIN_P may equal negative VIN_N. In some examples, however, VIN_P and VIN_N may be entirely independent of one another and controlled by an external circuit.

Figure 2:
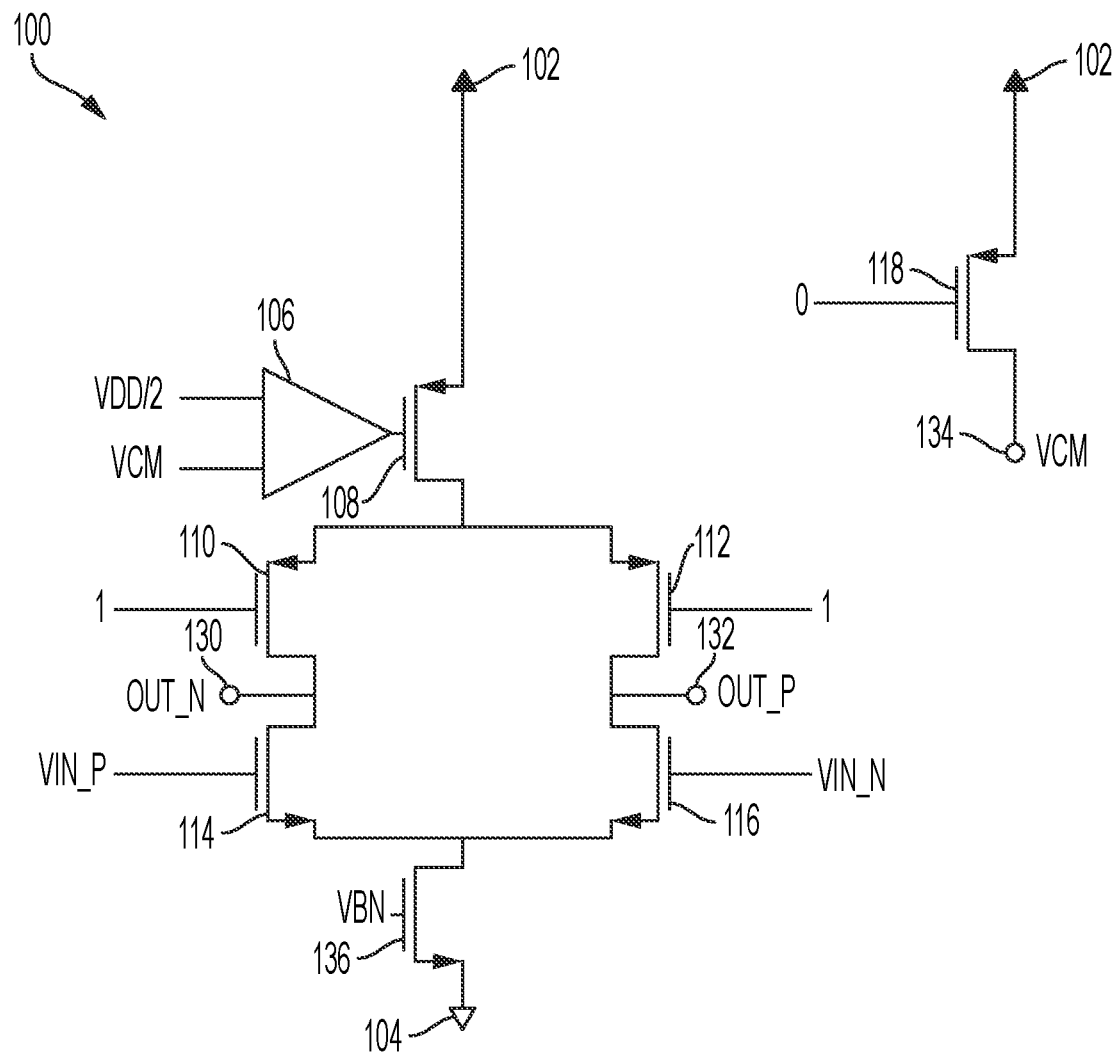
FIG. 2 illustrates a driver according to an example.

FIG. 2 illustrates multiplexed driver 100 operating in an open drain (OD) mode of operation according to an example. The gate of the second transistor 110 receives a high voltage ("1") from the first multiplexer 120, and the gate of the third transistor 112 receives a high voltage ("1") from the third multiplexer 124. The gate of the fourth transistor 114 receives VIN_P from the second multiplexer 122, and the gate of the fifth transistor 116 receives VIN_N from the fourth multiplexer 126. The gate of the sixth transistor 118 receives a voltage of "0" from the fifth multiplexer 128. The first switch 138 and the second switch 140 are both open.

As a result, the sixth transistor 118 is conducting, which pulls the VCM node 134 to a high state. The second transistor 110 and third transistor 112 are not conducting, and the fourth transistor 114 may conduct depending on the value of VIN_P, as may the fifth transistor 116 depending on the value of VIN_N. For example, a current may originate at the high voltage node 102, pass through the first transistor 108, and then pass through either the second transistor 110 or the third transistor 112 depending on the respective values of VIN_P and VIN_N. For example, if VIN_P is low and VIN_N is high, then current may pass through the third transistor 112 through the fifth transistor 116, then through the seventh transistor 136 to the low voltage node 104. If VIN_P is high and VIN_N is low, then current may pass through the second transistor 110 through the fourth transistor 114, and then through the seventh transistor 136 to the low voltage node 104.

Figure 3:
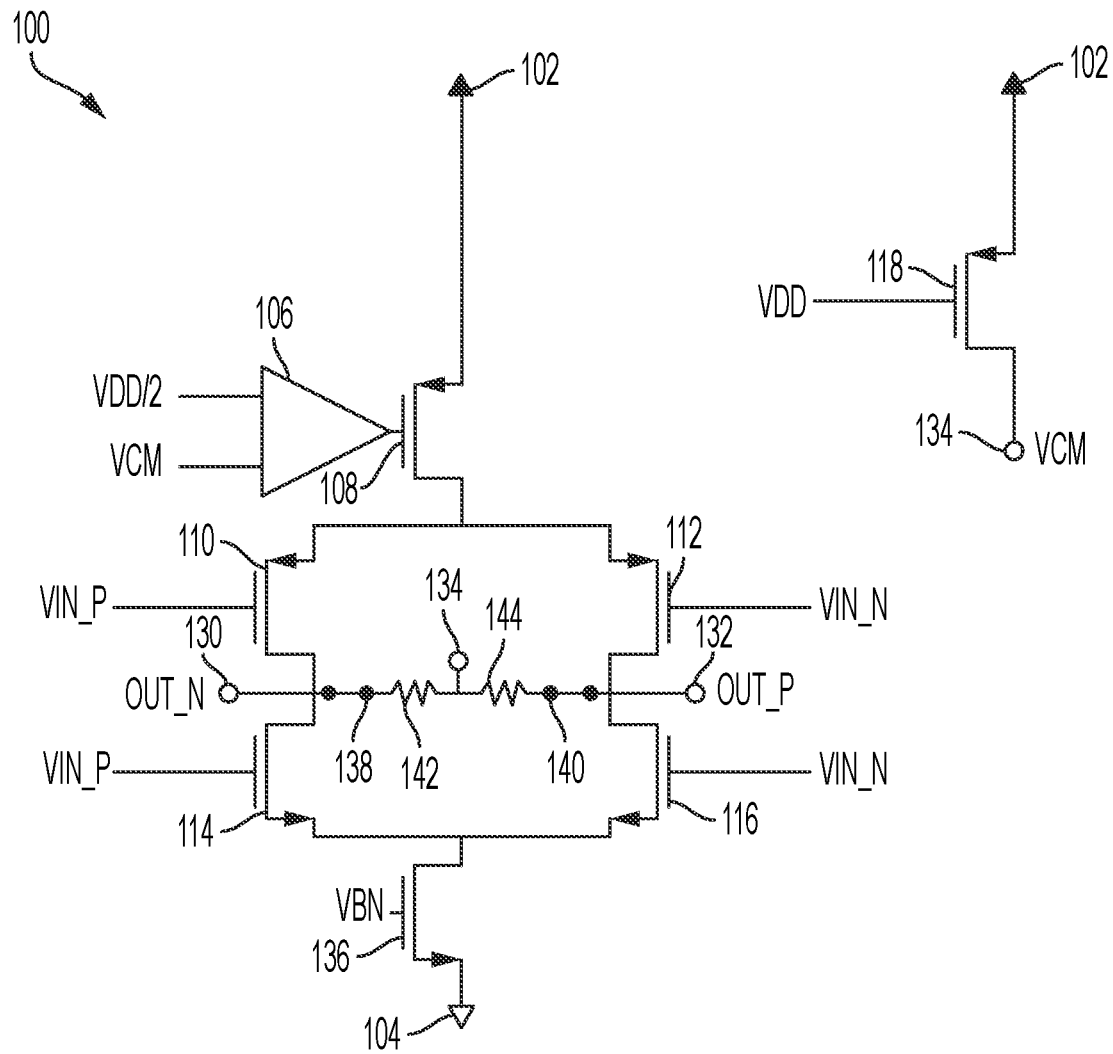
FIG. 3 illustrates a driver according to an example.

FIG. 3 illustrates the multiplexed driver 100 operating in an LVDS mode of operation according to an example. The first multiplexer 120 provides VIN_P to the gate of the second transistor 110. The second multiplexer 122 provides VIN_P to the gate of the fourth transistor 114. The third multiplexer 124 provides VIN_N to the gate of the third transistor 112. The fourth multiplexer 126 provides VIN_N to the gate of the fifth transistor 116. The fifth multiplexer 128 provides VDD to the gate of the sixth transistor 118.

As a result, in LVDS mode, current may travel from the high voltage node 102 through the first transistor 108 and to the node connecting the second transistor 110 and the third transistor 112. Because VIN_P is provided to the second transistor 110 and VIN_N is provided to the third transistor 112, if VIN_P is a positive value and VIN_N is a negative value, then the second transistor 110 will be open (e.g., not conducting), while the third transistor 112 will be closed (e.g., conducting). Therefore, the current will pass through the third transistor 112 to the first output node 130 and second output node 132 (via the closed first switch 138 and second switch 140). The fourth transistor 114 and fifth transistor 116 are n-type, and thus will be open if the voltage at their respective gates is low and open if the voltages are high. Because the fourth transistor 114 receives VIN_P, if VIN_P is high then the fourth transistor 114 will be closed. Because the fifth transistor 116 receives VIN_N, if VIN_N is low then the fifth transistor 116 will be open. Thus, current may cross the closed first switch 138 and closed second switch 140 from the third transistor 112 to the fourth transistor 114 and then through the seventh transistor 136 to the low voltage node 104.

Figure 6:
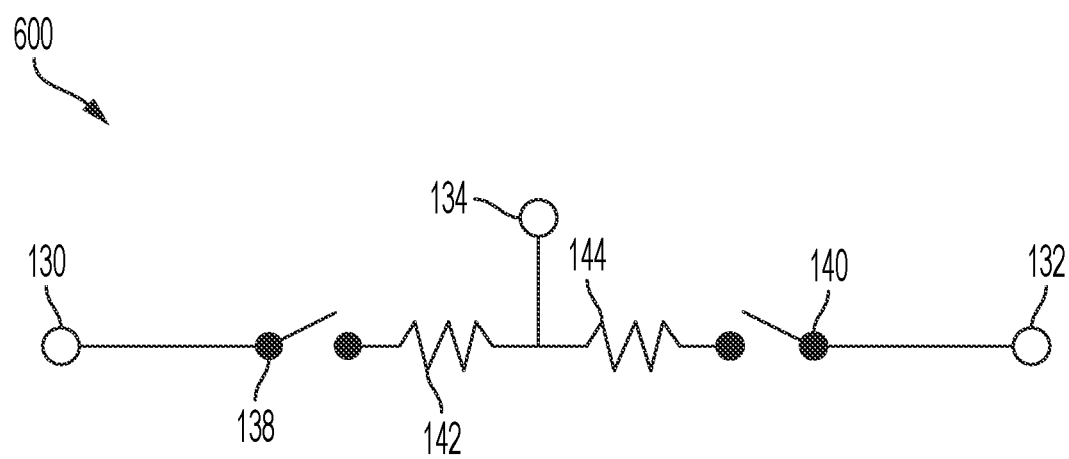
FIG. 6 illustrate a portion of a driver according to an example.

The first switch 138 and second switch 140 may have a resistance, include a resistance, or be coupled to one or more resistors. FIG. 6 illustrates one example of the first switch 138 and second switch 140 being coupled to resistors. Thus, there may be a voltage drop between the first output node 130 and the VCM node 134, and between the VCM node 134 and the second output node 132. As a result, a differential voltage may be determined between the first output node 130 and the second output node 132, and a common mode voltage may be determined at the VCM node 134.

Figure 4:
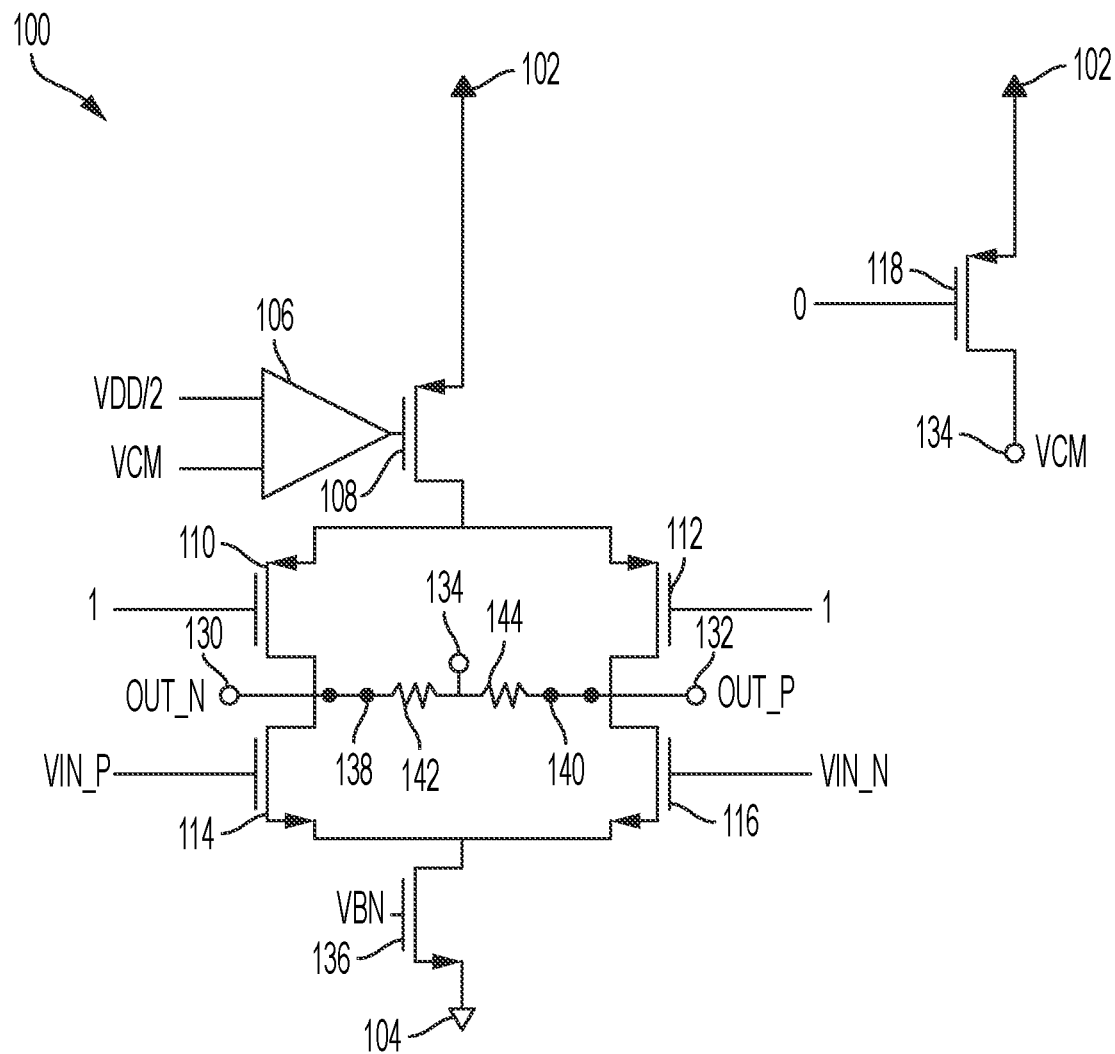
FIG. 4 illustrates a driver according to an example.

FIG. 4 illustrates the multiplexed driver 100 operating in a CML mode of operation according to an example. The first multiplexer 120 provides a high voltage (e.g., logical "1") to the gate of the second transistor 110. The second multiplexer 122 provides VIN_P to the gate of the fourth transistor 114. The third multiplexer 124 provides a high voltage (e.g., logical "1") to the gate of the third transistor 112. The fourth multiplexer 126 provides VIN_N to the gate of the fifth transistor 116. The fifth multiplexer 128 provides a low voltage (e.g., logical "0") to the gate of the sixth transistor 118.

As a result, in CML mode, current may originate at the high voltage node 102, pass through the sixth transistor 118, and then be provided to the VCM node 134. Some current may pass through the first switch 138 and/or the second switch 140, thus voltage drops may be determined across the first output node 130 and the VCM node 134, and/or the second output node 132 and the VCM node 134. If VIN_N is high and VIN_P is low, then current will pass through the fifth transistor 116 to the seventh transistor 136 and to the low voltage node 104. Alternatively, if VIN_P is high and VIN_N is low, the current will pass through the fourth transistor 114 to the seventh transistor 136 and then to the low voltage node 104. The path the current takes from VCM node 134 to the low voltage node 104 may, in some examples, determine the voltage drop across the output nodes 130, 132 and the VCM node 134

Figure 5:
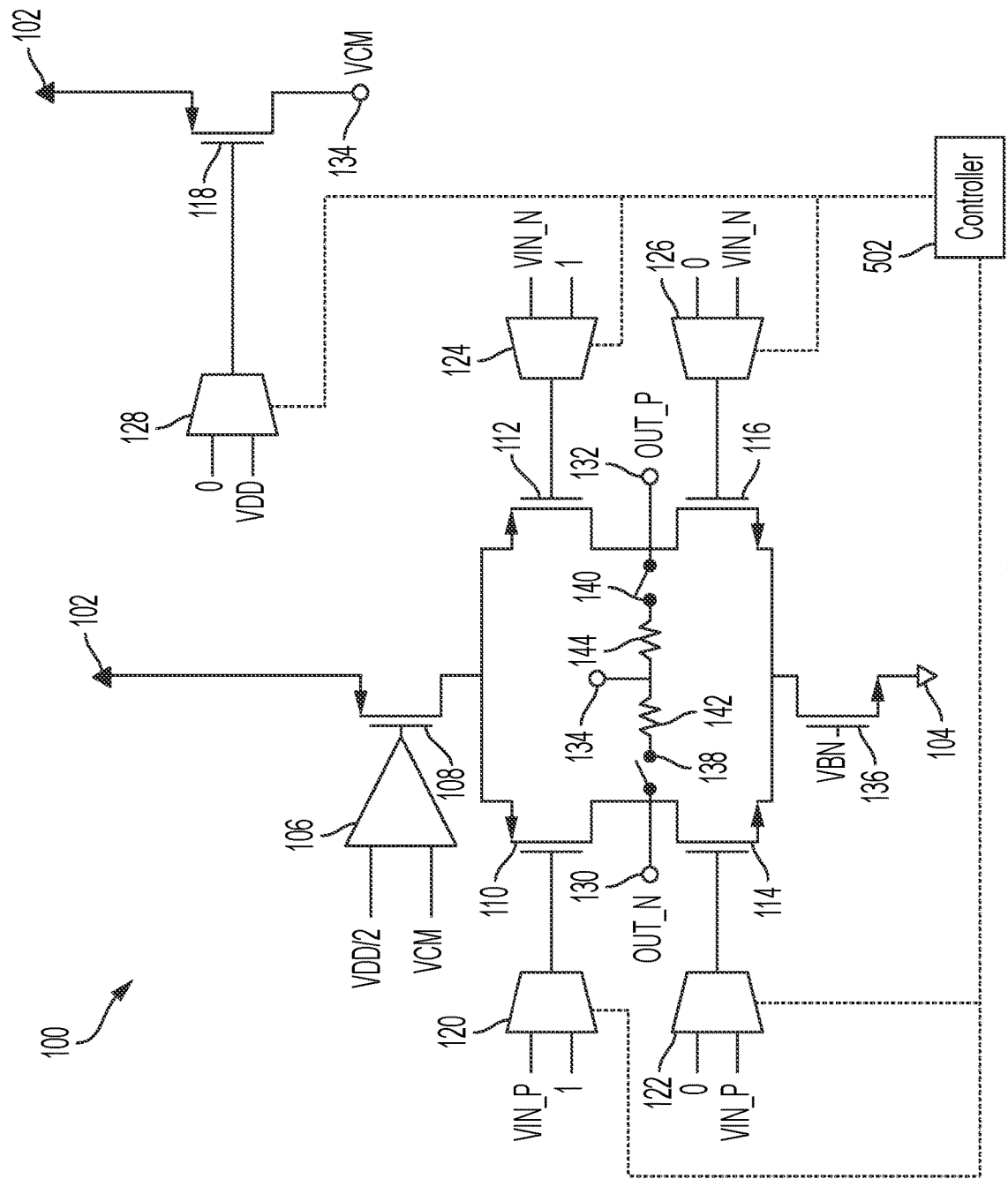
FIG. 5 illustrates a driver according to an example.

FIG. 5 illustrates at least one controller 502 ("controller 502") coupled to the multiplexed driver 100 according to an example. The controller 502 is coupled to the first multiplexer 120, the second multiplexer 122, the third multiplexer 124, the fourth multiplexer 126, and the fifth multiplexer 128. The controller 502 may be coupled to each multiplexer at a respective select input for that multiplexer. For example, the controller 502 may be coupled to the select input for the first multiplexer 120, the second multiplexer 122, the third multiplexer 124, the fourth multiplexer 126, and/or the fifth multiplexer 128.

The controller 502 is configured to provide a signal (such as a voltage corresponding to a logical input) to the multiplexers. The controller 502 may control the output of the multiplexers by controlling the select input for the multiplexers. For example, the controller 502 may control whether the first multiplexer 120 provides VIN_P or a high output to the gate of the second transistor 110. Likewise, the controller 502 may control whether the second multiplexer 122 provides a low voltage or VIN_P to the gate of the fourth transistor 114. The controller 502 may control whether the third multiplexer 124 provides a high voltage or VIN_N to the gate of the third transistor 112. The controller 502 may control whether the fourth multiplexer 126 provides a low voltage or VIN_N to the gate of the fifth transistor 116. The controller 502 may control whether the fifth multiplexer 128 provides a low voltage or VDD to the gate of the sixth transistor 118.

The controller 502 may execute instructions and/or be controllable, such that a user (such as a person, another circuit, a software program, and so forth) can determine how the multiplexed driver 100 operates, for example by setting the outputs of the multiplexers to correspond to a particular mode of operation of the multiplexed driver 100.

FIG. 6 illustrates a portion 600 of multiplexed driver 100 according to an example. The portion 600 includes the first output node 130, the first switch 138, the second output node 132, the second switch 140, the VCM node 134, a first resistor 142, and a second resistor 144.

The first output node 130 is coupled to the first switch 138 at a first connection. The first switch 138 is coupled to the first output node 130 at a first connection and to the first resistor 142 at a second connection. The first resistor 142 is coupled to the first switch 138 at a first connection and to the VCM node 134 and second resistor 144 at a second connection. The VCM node 134 is coupled to the first resistor 142 and the second resistor 144. The second resistor 144 is coupled to the first resistor 142 and the VCM node 134 at a first connection and to the second switch 140 at a second connection. The second switch 140 is coupled to the second resistor 144 at a first connection and to the second output node 132 at a second connection.

The first resistor 142 and second resistor 144 may be separate resistances or may be the same (in which case, the VCM node 134 may correspond to a tap located along a length of the first resistor 142 and second resistor 144). The first resistor 142 may have resistance (or impedance) equal to or different than the resistance (or impedance) of the second resistor 144. The first resistor 142 and second resistor 144 may be impedances rather than purely resistances.

The portion 600 may be placed between the first output node 130 and the second output node 132 in the multiplexed driver 100.

Figure 7:
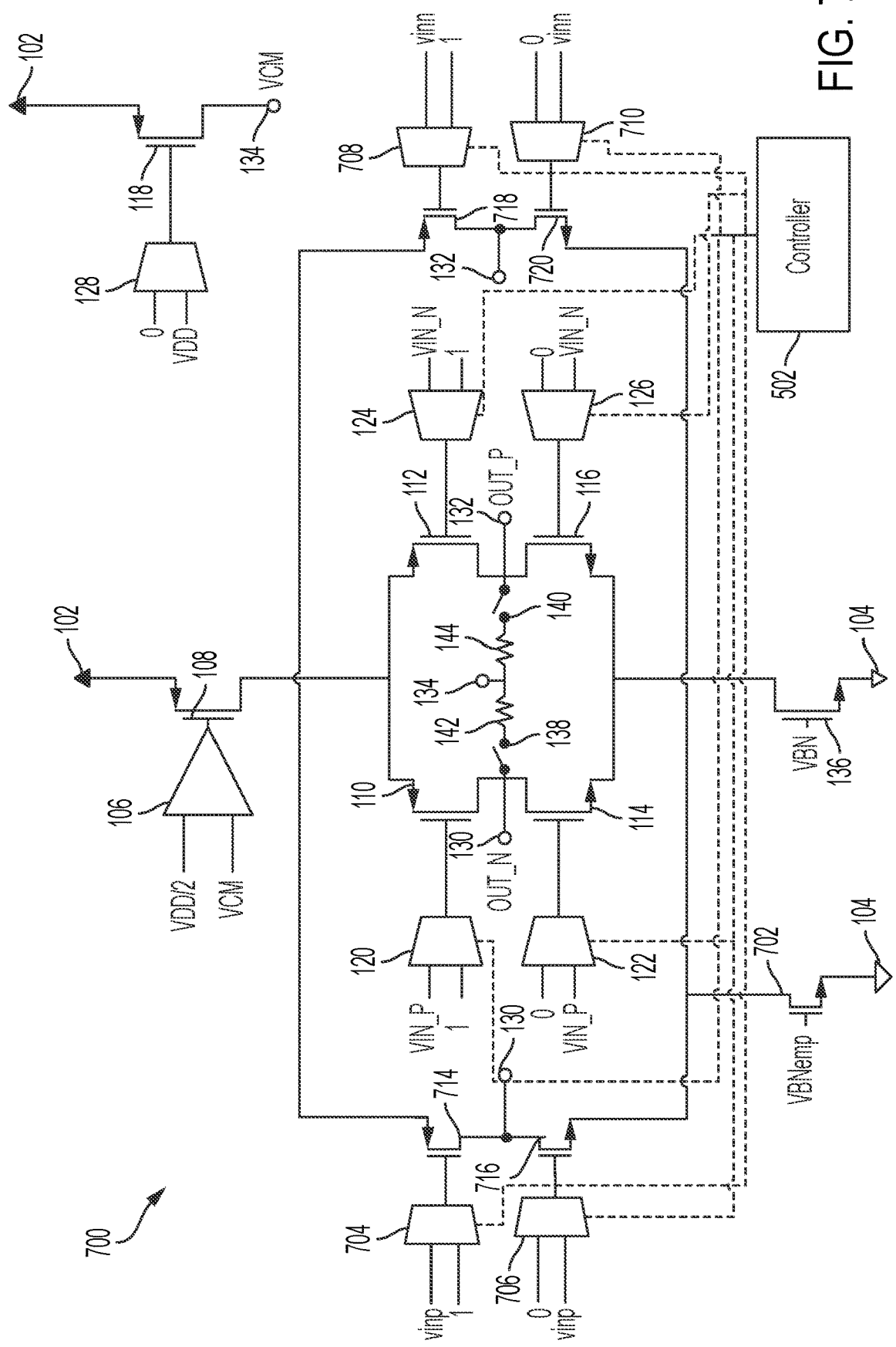
FIG. 7 illustrates a topology of a multiplexed driver according to an example.

FIG. 7 illustrates a topology of a multiplexed driver 700 according to an example. The multiplexed driver 700 includes an VBN transistor 702, a first multiplexer 704, a second multiplexer 706, a third multiplexer 708, a fourth multiplexer 710, a first transistor 714, a second transistor 716, a third transistor 718, and a fourth transistor 720. The multiplexed driver 700 also includes the multiplexed driver 100 of FIG. 1 and the controller 502.

The controller 502 is coupled to the first multiplexer 704, second multiplexer 706, third multiplexer 708, and fourth multiplexer 710 and configured to control the state of each of those multiplexers. That is, the controller 502 may control the 'select' input of each multiplexer to determine the output of the respective multiplexer.

The first multiplexer 704 is coupled to VIN_P at a first input, and a high voltage at a second input, and to the gate of the first transistor 714 at an output. The second multiplexer 706 is coupled to a low voltage at a first input, VIN_P at a second input, and the gate of the second transistor 716 at an output. The third multiplexer 708 is coupled to VIN_N at a first input, a high voltage at a second input, and to the gate of the third transistor 718 at an output. The fourth multiplexer 710 is coupled to a low voltage at a first input, VIN_N at a second input, and the gate of the fourth transistor 720 at an output. The first transistor 714 is coupled to the third transistor 718 at a first connection and to the first output node 130 at a second connection. The second transistor 716 is coupled to the first output node 130 at a first connection and to the VBN transistor 702 and fourth transistor 720 at a second connection. The third transistor 718 is coupled to the first transistor 714 at a first connection and to the second output node 132 at a second connection. The fourth transistor 720 is coupled to the second output node 132 at a first connection and to the second transistor 716 and VBN transistor 702 at a second connection. The VBN transistor 702 is coupled to the second transistor 716 and fourth transistor 720 at a first connection and to the low voltage node 104 at a second connection. The gate of the VCN transistor 702 is coupled to a VBN input that provides a VBN signal during preemphasis/deemphasis but may otherwise be off and/or on.

The multiplexed driver 700 can provide preemphasis during various modes, as described in the table below. In the table, MX1 refers to the first multiplexer 704, MX2 refers to the second multiplexer 706, MX3 refers to the third multiplexer 708, and MX4 refers to the fourth multiplexer 710. In the table, "preemp" indicates that preemphasis is provided in a given mode. That is, preemp CML means preemphasis is provided during CML mode, preemp LVDS means preemphasis is provided during LVDS mode, preemp OD means preemphasis is provided during OD mode, and no preemp means no preemphasis is provided.

| Mode | MX1 | MX2 | MX3 | MX4 |
|---|---|---|---|---|
| Preemp CML | 1 | VIN_P | 1 | VIN_N |
| Preemp LVDS | VIN_P | VIN_P | VIN_N | VIN_N |
| Preemp OD | 1 | VIN_P | 1 | VIN_N |
| No preemp | 1 | 0 | 1 | 0 |

In some examples, the multiplexed driver 700 may also provide deemphasis.

Figure 8:
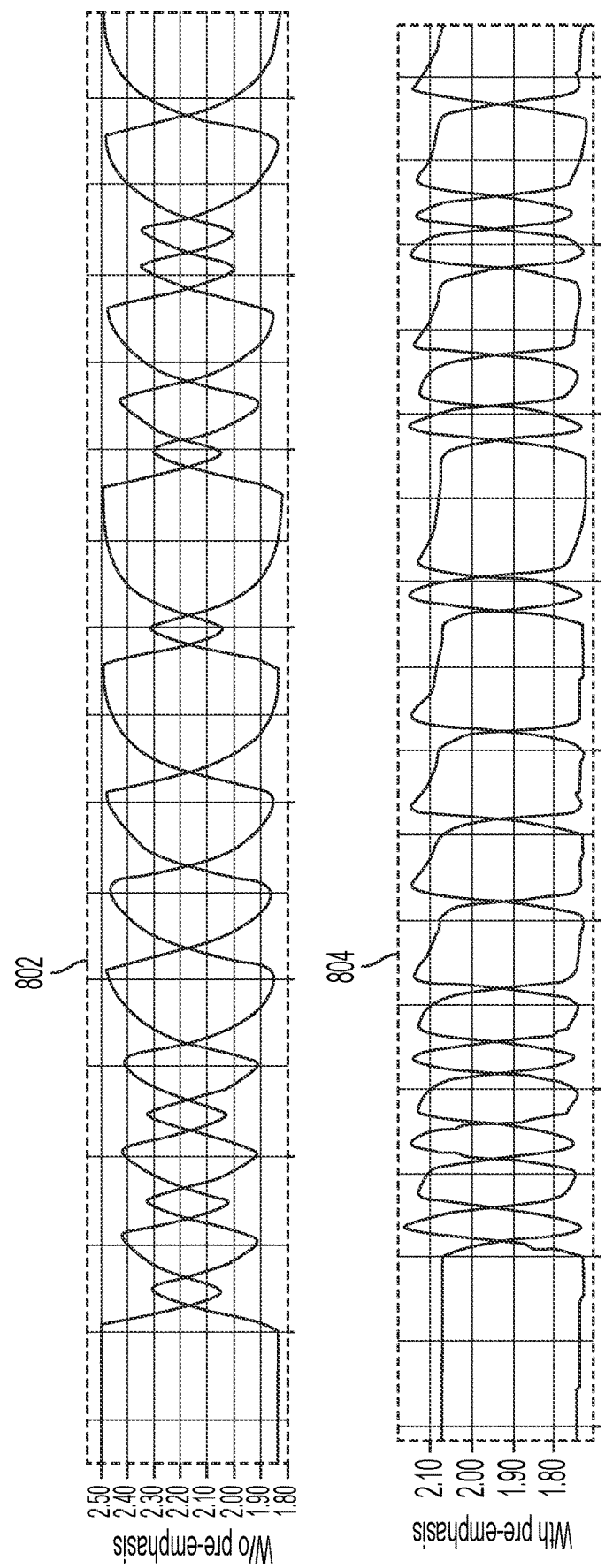
FIG. 8 illustrates a trace showing the operation of a multiplexed driver according to an example.

Providing preemphasis smooths signals during operation, as will be illustrated with respect to FIG. 8. In some examples, the auxiliary driver (that is, the first through fourth multiplexers 704-710, VBN transistor 702, and first through fourth transistor 714-720) may receive data from a source at a delay of one clock cycle compared to the multiplexed driver 100. In some examples, both the multiplexed driver 100 and auxiliary driver may by synchronized for one cycle when data switches from first data to second data. That is, suppose a telecommunication system or similar where data is being received in some form (e.g., as a voltage value, frequency, duration, combination thereof, or otherwise). During many cycles, the auxiliary driver and multiplexed driver 100 will be one cycle out of phase. However, when the data switches (e.g., from one value to a new value), the drivers will be synchronized.

FIG. 8 illustrates the operation of the multiplexed driver 700 and/or multiplexed driver 100 with and without preemphasis. A first trace 802 illustrates the operation of the multiplexed driver 700 without preemphasis and the second trace 804 illustrates the operation of the multiplexed driver 700 with preemphasis.

When operated without preemphasis, the first trace 802 illustrates that the signal output from the multiplexed driver 700 increases gradually over relatively long periods of time. However, when operation with preemphasis, the second trace 804 illustrates that the signal output from the multiplexed driver 700 rapidly peaks and then tapers slowly over time. Each of the first trace 802 and second trace 804 contain two lines showing the voltages corresponding to the first output 130 and second output 132. Points where the two lines intersect may, in some examples, represent a point when the data switches from one value to another.

In some examples, VIN_P and VIN_N may be differential data signals that are generated using a serializer or other circuit.

Various controllers, such as the controller 502, may execute various operations discussed above. Using data stored in associated memory and/or storage, the controller 502 also executes one or more instructions stored on one or more non-transitory computer-readable media, which the controller 502 may include and/or be coupled to, that may result in manipulated data. In some examples, the controller 502 may include one or more processors or other types of controllers. In one example, the controller 502 is or includes at least one processor. In another example, the controller 502 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A configurable driver comprising:
   a first transistor of a first type coupled to a first node;
   a second transistor of the first type coupled to a second node;
   a first transistor of a second type coupled to the first node;
   a second transistor of a second type coupled to the second node;
   a first multiplexer coupled to a gate of the first transistor of the first type;
   a second multiplexer coupled to a gate of the second transistor of the first type;
   a third multiplexer coupled to a gate of the first transistor of the second type;
   a fourth multiplexer coupled to a gate of the second transistor of the second type; and
   one or more switching devices coupled between the first node and the second node.

2. The configurable driver of claim 1 further comprising:
   a high voltage node coupled to a transistor; and
   an amplifier coupled to the transistor, wherein the transistor is coupled to the first transistor of the first type and the second transistor of the first type.

3. The configurable driver of claim 2 wherein an input of the amplifier is coupled between the first node and the second node.

4. The configurable driver of claim 1 further comprising:
   a low voltage node coupled to a transistor, wherein the transistor is coupled to the first transistor of the second type and the second transistor of the second type.

5. The configurable driver of claim 1 further comprising:
   a node coupled between a first switching device and a second switching device of the one or more switching devices;
   a transistor coupled between the node and a high voltage node; and
   a multiplexer coupled to a gate of the transistor.

6. The configurable driver of claim 5 wherein the multiplexer is configured to provide a voltage to the gate of the transistor, the voltage selected from among a set including a first voltage and a second voltage, the first voltage being less than the second voltage.

7. The configurable driver of claim 1 wherein:
   the first multiplexer is configured to provide a first voltage and a second voltage to the gate of the first transistor of the first type, the first voltage being less than the second voltage;
   the second multiplexer is configured to provide a third voltage and a fourth voltage to the gate of the second transistor of the first type, the third voltage being less than the fourth voltage;
   the third multiplexer is configured to provide a fifth voltage and a sixth voltage to the gate of the first transistor of the second type, the fifth voltage being less than the sixth voltage; and the fourth multiplexer is configured to provide a seventh voltage and an eighth voltage to the gate of the second transistor of the second type, the seventh voltage being less than the eighth voltage.

8. The configurable driver of claim 1 wherein the configurable driver is configured to operate in two or more modes of operation based on a configuration of one or more of the first multiplexer, the second multiplexer, the third multiplexer, and the fourth multiplexer.

9. The configurable driver of claim 8 wherein the two or more modes of operation include:
   a current mode logic (CML) mode of operation;
   a low voltage differential signaling (LVDS) mode of operation; and
   an open drain (OD) mode of operation.

10. The configurable driver of claim 9 wherein the configurable driver operates in the CML mode of operation when:
    the first multiplexer provides a high voltage to the gate of the first transistor of the first type;
    the second multiplexer provides a high voltage to the gate of the second transistor of the first type;
    a first switch of the one or more switching devices is closed; and
    a second switch of the one or more switching devices is closed.

11. The configurable driver of claim 9 wherein the configurable driver operates in the LVDS mode of operation when:
    the first multiplexer provides a voltage to the gate of the first transistor of the first type derived from a first voltage input of the configurable driver;
    the second multiplexer provides a voltage to the gate of the second transistor of the first type derived from a second voltage input of the configurable driver;
    the third multiplexer provides a voltage to the gate of the first transistor of the second type derived from the first voltage input; and
    the fourth multiplexer provides a voltage to the gate of the second transistor of the second type derived from the second voltage input.

12. The configurable driver of claim 11 wherein:
    a first switch of the one or more switching devices is closed; and
    a second switch of the one or more switching devices is closed.

13. The configurable driver of claim 9 wherein the configurable driver operates in the OD mode of operation when:
    the first multiplexer provides a high voltage to the gate of the first transistor of the first type;
    the second multiplexer provides a high voltage to the gate of the second transistor of the first type;
    a first switch of the one or more switching devices is open; and
    a second switch of the one or more switching devices is open.

14. A method of determining a mode of operation for a multiplexed driver, the method comprising:
    determining the mode of operation for the multiplexed driver selected from among a plurality of modes of operation;
    responsive to determining the mode of operation:
      setting a state of a first multiplexer coupled to a gate of a first transistor of a first type,
      setting a state of a second multiplexer coupled to a gate of a second transistor of the first type,
      setting a state of a third multiplexer coupled to a gate of a first transistor of a second type, and
      setting a state of a fourth multiplexer coupled to a gate of a second transistor of the second type; and
    responsive to setting the states of the multiplexers:
      setting a state of at least one switch coupled between the first multiplexer, the second multiplexer, the third multiplexer, and the fourth multiplexer.

15. The method of claim 14 wherein the mode of operation is an open drain (OD) mode of operation.

16. The method of claim 15 wherein:
    setting the state of the first multiplexer includes setting the first multiplexer to provide a high voltage;
    setting the state of the third multiplexer includes setting the third multiplexer to provide a high voltage; and
    setting the state of the at least one switch includes setting the at least one switch to be open.

17. The method of claim 15 further comprising setting a state of a fifth multiplexer to provide a low voltage.

18. The method of claim 14 wherein the mode of operation is a low voltage differential signaling (LVDS) mode of operation.

19. The method of claim 18 wherein:
    setting the state of the first multiplexer includes setting the first multiplexer to provide a voltage derived from a first input;
    setting the state of the third multiplexer includes setting the third multiplexer to provide a voltage derived from a second input; and
    setting the state of the at least one switch includes setting the at least one switch to be closed.

20. The method of claim 18 further comprising setting a state of a fifth multiplexer to provide a high voltage.

21. The method of claim 14 wherein the mode of operation is a current mode logic (CML) mode of operation.

22. The method of claim 21 wherein:
    setting the state of the first multiplexer includes setting the first multiplexer to provide a high voltage;
    setting the state of the third multiplexer includes setting the third multiplexer to provide a high voltage; and
    setting the state of the at least one switch includes setting the at least one switch to be closed.

* * * * *